United States Patent
Matsuo (10) Patent No.: US 6,833,596 B2
(45) Date of Patent: Dec. 21, 2004

(54) SEMICONDUCTOR DEVICE AND METHOD OF MANUFACTURING THE SAME

(75) Inventor: Kouji Matsuo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/396,453

(22) Filed: Mar. 26, 2003

(65) Prior Publication Data

US 2004/0000695 A1 Jan. 1, 2004

(30) Foreign Application Priority Data

Mar. 27, 2002 (JP) ........................................ 2002-087505

(51) Int. Cl.$^7$ .............................................. H01L 29/76
(52) U.S. Cl. ...................... 257/412; 257/408; 257/409; 257/410; 257/411; 257/413; 438/216; 438/585
(58) Field of Search ................................ 257/412, 413, 257/411, 410, 408, 409; 438/216, 217, 385

(56) References Cited

U.S. PATENT DOCUMENTS

| | | | | |
|---|---|---|---|---|
| 5,093,701 A | * | 3/1992 | Nakagawa et al. | 257/341 |
| 5,436,178 A | * | 7/1995 | Kimura | 438/305 |
| 5,801,427 A | * | 9/1998 | Shiratake et al. | 257/412 |
| 6,265,258 B1 | | 7/2001 | Liang et al. | |
| 6,376,888 B1 | | 4/2002 | Tsunashima et al. | |

FOREIGN PATENT DOCUMENTS

| JP | 2000-223588 | 8/2000 |
|---|---|---|
| JP | 2000-252370 | 9/2000 |

OTHER PUBLICATIONS

Matsuo, K., "Semiconductor Device and Method of Fabricating the Same", U.S. patent application No. 09/962,883, filed Sep. 25, 2001.

* cited by examiner

Primary Examiner—Nathan J. Flynn
Assistant Examiner—Fazli Erdem
(74) Attorney, Agent, or Firm—Finnegan, Henderson, Farabow, Garrett & Dunner, L.L.P.

(57) ABSTRACT

A semiconductor device is disclosed, which comprises a semiconductor substrate, a gate insulating film formed on the semiconductor substrate, a gate electrode layer formed on the gate insulating film, source and drain regions formed at both sides of the gate electrode layer, and a channel region between the source and drain regions, wherein the gate electrode layer comprises a polycrystalline silicon layer and a metal layer formed between the gate insulating film and the polycrystalline silicon layer, and the metal layer has an electron density of $1.0 \times 10^{21}$ atoms/cm$^3$ or more.

19 Claims, 8 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2002-087505, filed Mar. 27, 2002, the entire contents of which are incorporated herein by reference.

BACKGROUND OF THE INVENTION

1. Field of the Invention

The present invention relates to a semiconductor device and a method of manufacturing the same. In particular, the present invention relates to a gate electrode layer of transistors.

2. Description of the Related Art

Conventionally, polycrystalline silicon has been mainly used as the material of a gate electrode layer of MOS transistors (hereinafter, referred to as MOSFET). This is based on the following reasons. The above polycrystalline silicon stabilizes the interface state between a gate electrode layer and a gate insulating film (gate oxide film) existing under gate electrode layer, and is excellent in mutual adhesion. In addition, impurity elements introduced into the polycrystalline silicon are properly selected, and thereby, in N-type and P-type MOSFETs, it is possible to form a gate electrode layer having the optimal work function, and to control threshold voltage values.

However, with the development of micro-fabrication in MOSFET, depletion in the gate electrode layer must be considered as a serious problem incapable of disregarding. More specifically, the above depletion of the gate electrode layer is that when voltage is applied to the gate electrode layer, a depletion layer is formed at a gate electrode layer region near to the interface between the gate electrode layer and the gate insulating film.

The cause of the depletion of the gate electrode layer arises from the reason why a polycrystalline silicon film is used as the material of semiconductors. In N-type and P-type MOSFETs, the polycrystalline silicon film functions as the gate electrode layer. In this case, in order to fulfill the above function, impurity elements must be introduced into the polycrystalline silicon film, using ion implantation technique. However, there exists the upper limit in the concentration of impurities such as donor or acceptor introduced into the polycrystalline silicon film. From the above reasons, it can be seen that it is difficult to eliminate the depletion of the gate electrode layer when forming the gate electrode layer using the polycrystalline silicon film. On the contrary, metals are used as the material of the gate electrode layer, what is called, the technical development of MOSFET including a metal gate electrode layer has been made. In such MOSFET, the entirety of the gate electrode layer or the gate electrode layer interface contacting with the gate insulating film is formed of refractory metal materials, i.e., metal materials having a high melting-point. By doing so, it is possible to eliminate the depletion of the gate electrode layer.

If the gate electrode layer is formed using dry etching technique, it may be formed in the following manner. The principal portion of the gate electrode layer is formed of the polycrystalline silicon film; on the other hand, the gate electrode layer interface contacting with the gate insulating film is formed of refractory metal materials. In this case, the polycrystalline silicon film can be readily and accurately formed into a gate electrode layer pattern using the conventional dry etching technique.

The manufacturing process of semiconductor devices according to the conventional technique will be described below with reference to FIG. 6 to FIG. 8. Here, the method of manufacturing CMOS transistors will be described as one example.

FIGS. 6A to 6C, FIGS. 7A to 7C and FIGS. 8A to 8C are cross-sectional views in a direction vertical to the lengthwise direction of the gate electrode layer in N-type and P-type MOSFETs.

Figure 6A:
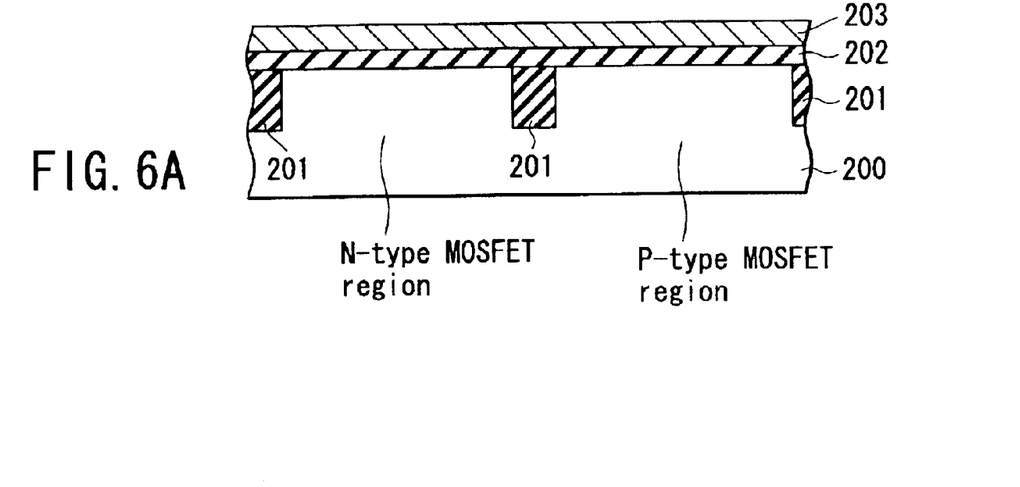
FIG. 6A to FIG. 6C are cross-sectional views showing a conventional manufacturing process of semiconductor devices.

As shown in FIG. 6A, a shallow trench isolation region 201 is formed on a silicon substrate 200 with a predetermined interval using known STI (Shallow Trench Isolation) technique. Thereafter, an aluminum oxide film ($Al_2O_3$ film) 202 and a titanium nitride film 203 are successively formed.

Each interval between the isolation regions 201 is used as a device forming region where a semiconductor device such as N-type or P-type MOS transistor is formed. In the present example, as seen from FIG. 6A, the left side is an N-type MOSFET region; on the other hand, the right side is a P-type MOSFET region.

The aluminum oxide film ($Al_2O_3$ film) 202 is used as the material for forming the gate insulating film of the N-type and P-type MOSFETs so as to have a thickness of about 2 nm. In addition, the refractory metal material, that is, the titanium nitride film 203 is used as part of the gate electrode layer so as to have a thickness of about 10 nm.

Figure 6B:
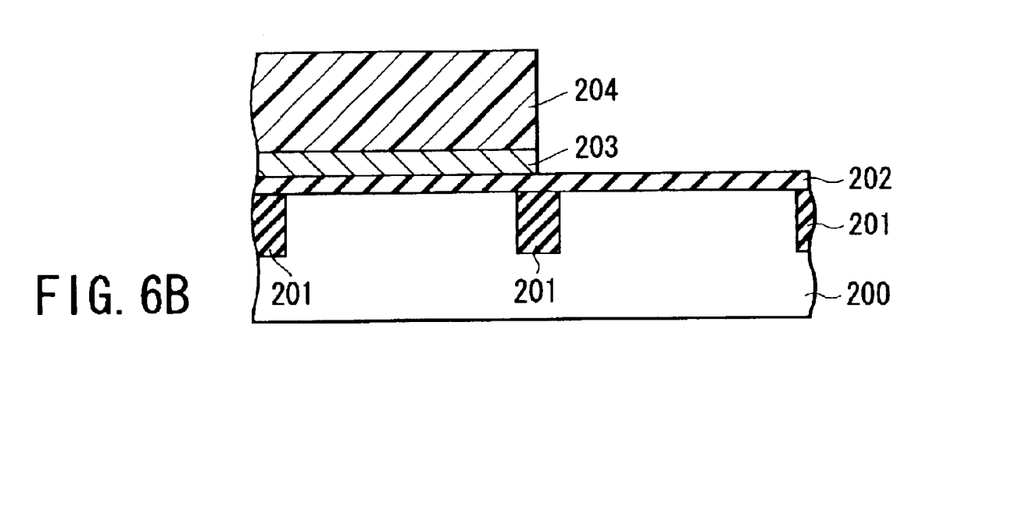
Figure 6C:
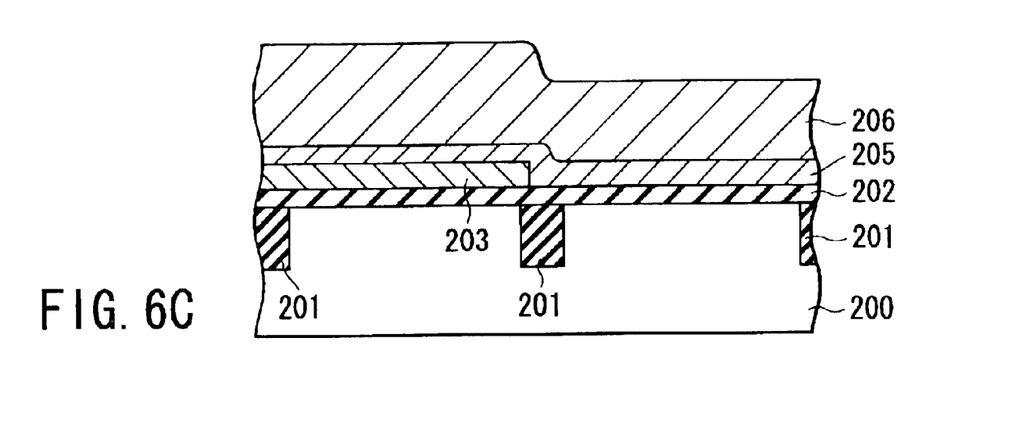

As depicted in FIG. 6B, a photo resist film 204 is formed so as to cover the N-type MOSFET region using lithography technique. Thereafter, wet etching is carried out using the photo resist film 204 as a mask so that the titanium nitride film 203 existing on the P-type MOSFET region can be removed. In this case, hydrogen peroxide water ($H_2O_2$) is used for the wet etching process so that the titanium nitride film 203 existing on the P-type MOSFET region can be removed.

As described above, the titanium nitride film 203 existing on the P-type MOSFET region is removed by the above wet etching process. Thereafter, the aluminum oxide film ($Al_2O_3$) 202 (gate insulating film) on the P-type MOSFET region is directly exposed to a processing solution, and then, the surface is non-uniformly etched by the processing solution. For this reason, flatness reduces in the surface of the aluminum oxide film ($Al_2O_3$) 202; as a result, reliability as gate insulating film also reduces.

A mixed solution of sulfuric acid and hydrogen peroxide water is used so that the photo resist film 204 can be removed. Thereafter, as illustrated in FIG. 6C, a tungsten nitride film 205 is formed as a refractory metal film on the N-type and P-type MOSFET regions so as to have a thickness of about 10 nm. Next, a polycrystalline silicon film 206 is formed over the entire surface of the above tungsten film by CND process. In this case, the polycrystalline silicon film 206 is formed in a state of containing impurities such as phosphorus (P).

In the N-type MOSFET region, the tungsten nitride film 205 is formed on the titanium nitride film 203 in the multi-layer form. In the P-type MOSFET region, the tungsten nitride film 205 is used as the material for forming a metal gate layer.

Heat treatment (anneal process) of about 800° C. is carried out so that impurities (e.g., phosphorus (P)) contained in the polycrystalline silicon film 206 can be activated. Thereafter, as shown in FIG. 7A to FIG. 7C, a gate electrode layer pattern will be formed on each of the N-type and P-type MOSFET regions using lithography and dry etching techniques.

Figure 7A:
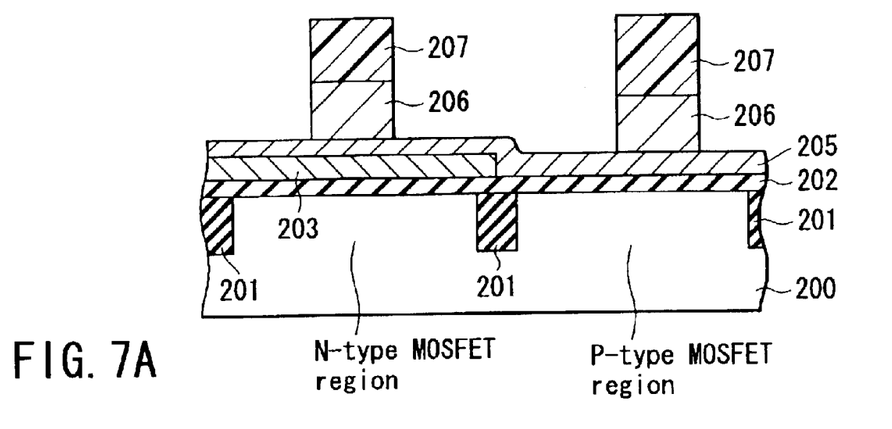
FIG. 7A to FIG. 7C are cross-sectional views showing a conventional manufacturing process of semiconductor devices.

First, as illustrated in FIG. 7A, in each of the N-type and P-type MOSFET regions, a gate electrode layer pattern is formed on polycrystalline silicon film 206 using a photo resist pattern 207 as a mask. More specifically, in each of the N-type and P-type MOSFET regions, the photo resist pattern 207 having a dimension and shape of the gate electrode layer is simultaneously formed on the polycrystalline silicon film 206 using lithography techniques. Thereafter, the photo resist film 207 is used as a mask, and then, a gate electrode layer pattern is transferred to the polycrystalline silicon film 206 using dry etching technique such as reactive ion etching (hereinafter, referred to as RIE).

Figure 7B:
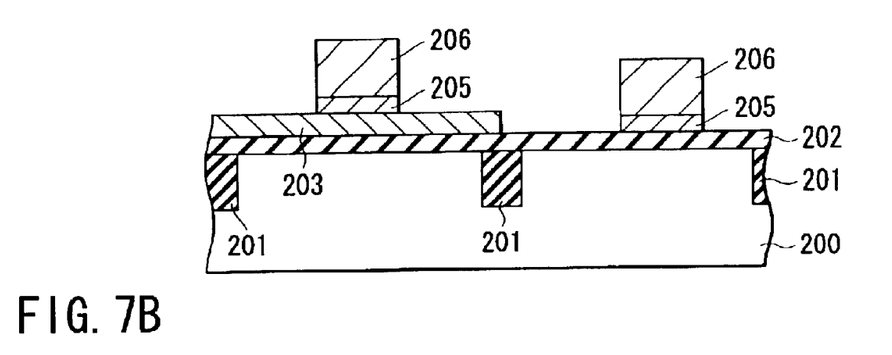

As seen from FIG. 7B, in each of the N-type and P-type MOSFET regions, with the use of the polycrystalline silicon film 206, the tungsten nitride film 205 is simultaneously etched into a predetermined dimension and shape using dry etching technique. In this case, RIE process is employed as the dry etching technique.

Figure 7C:
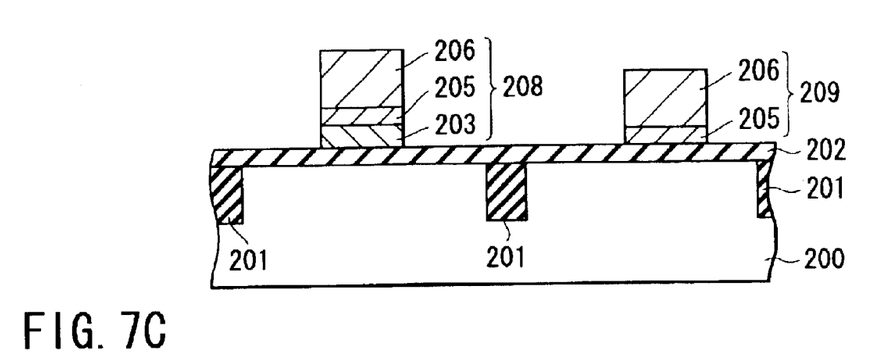

As shown in FIG. 7C, in the N-type MOSFET region, with the use of a multi-layer pattern of the polycrystalline silicon film 206 and the tungsten nitride film 205 as a mask, the titanium nitride film 203 is etched into a predetermined dimension and shape using dry etching technique. In this case, RIE process is employed as the dry etching technique.

In the above manner, a multi-layer gate electrode layer 208 (polycrystalline silicon film 206/tungsten nitride film 205/titanium nitride film 203) is formed in the N-type MOSFET region. Likewise, a multi-layer gate electrode layer 209 (polycrystalline silicon film 206/tungsten nitride film 205) is formed in the P-type MOSFET region.

Figure 8A:
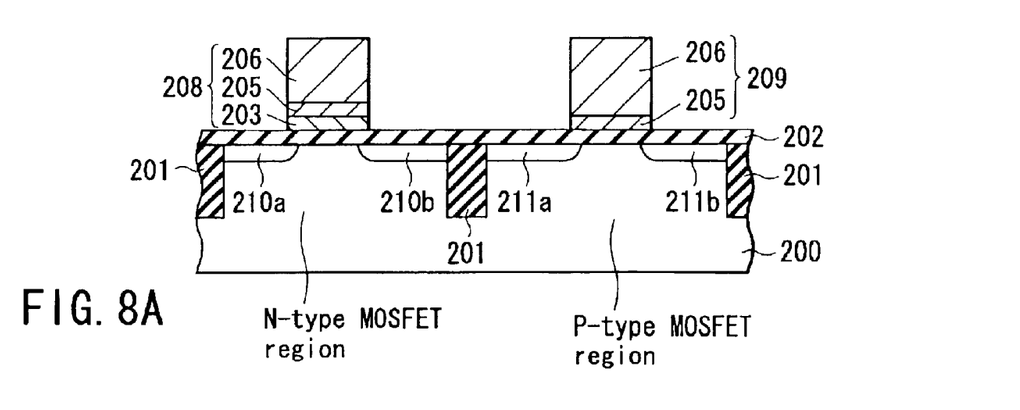
FIG. 8A to FIG. 8C are cross-sectional views showing a conventional manufacturing process of semiconductor devices.
Figure 8B:
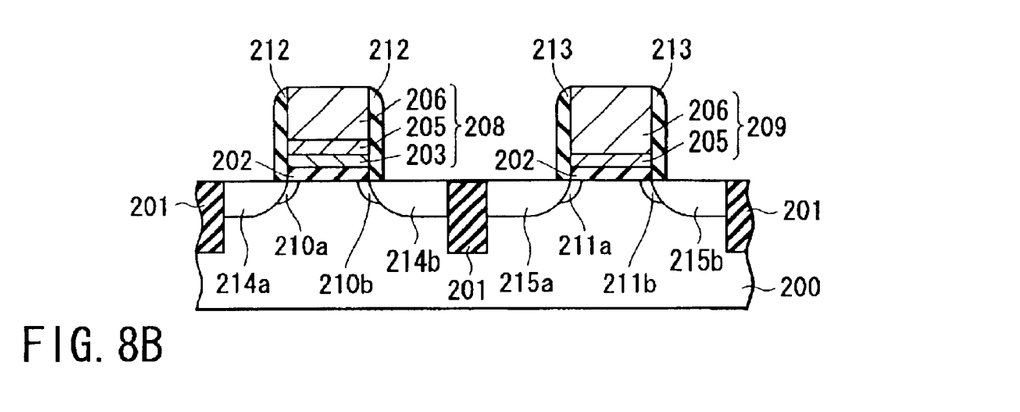
Figure 8C:
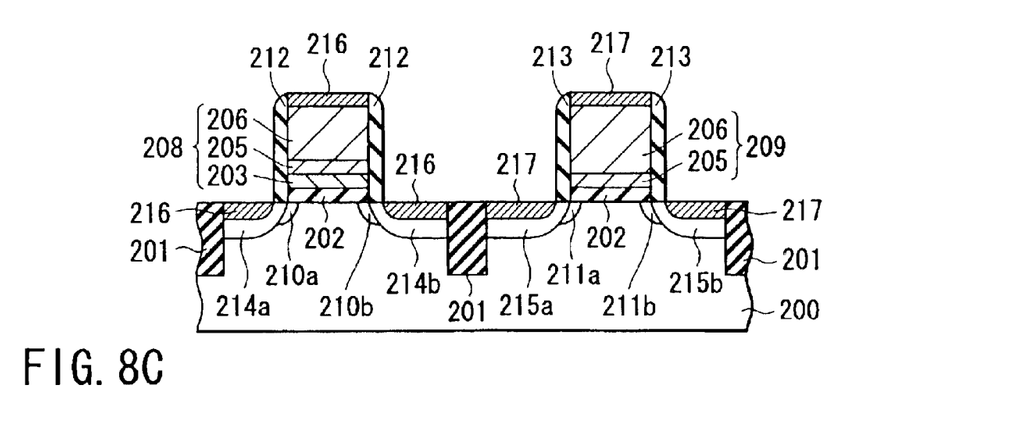

Thereafter, as depicted in FIG. 8A to FIG. 8C, source and drain regions will be formed in each of the N-type and P-type MOSFET regions using the above gate electrode layers 208 and 209 as a mask. The following is a detailed description on the formation of the source and drain regions.

As illustrated in FIG. 8A, in the N-type and P-type MOSFET regions, N-type shallow junction regions 210a, 210b and P-type shallow junction regions 211a, 211b are formed at the positions of the source and drain regions.

First, in the N-type MOSFET region, impurities are introduced using the gate electrode layer 208 as a mask, and thereafter, N-type shallow junction regions 210a and 210b are formed at the positions of the source and drain regions. In this case, although is not specially illustrated, in the N-type MOSFET region, phosphorus (P) or arsenic (As) is introduced into source and drain shallow regions at a predetermined concentration (dosage) using ion implantation technique.

Likewise, in the P-type MOSFET region, impurities are introduced using the gate electrode layer 209 as a mask, and thereafter, P-type shallow junction regions 211a and 211b are formed at the positions of the source and drain regions. In this case, although is not specially illustrated, in the P-type MOSFET region, boron (B) is introduced into the shallow position of the source and drain shallow regions at a predetermined concentration (dosage) using ion implantation technique.

Thereafter, heat treatment (anneal process) is carried out so that impurities of the above N-type shallow junction regions 210a; 210b and P-type shallow junction regions 211a; 211b can be activated.

As seen from FIG. 8B, in the N-type MOSFET region, using the gate electrode layer 208 and a gate sidewall insulation film 212 as a mask, N-type deep junction regions 214a and 214b are formed at the positions of the source and drain regions. Likewise, in the P-type MOSFET region, using the gate electrode layer 209 and a gate sidewall insulation film 213 as a mask, P-type deep junction regions 215a and 215b are formed at the positions of the source and drain regions.

In this case, using a silicon nitride film, gate sidewall insulation films 212 and 213 are formed along each sidewall of the gate electrode layers 208 and 209. Thereafter, in the N-type MOSFET region, using the gate electrode layer 208 and the gate sidewall insulation film 212 as a mask, impurities are introduced so that the above N-type deep junction regions 214a and 214b can be formed at the positions of the source and drain regions. In this case, although is not specially illustrated, in the N-type MOSFET region, phosphorus (P) or arsenic (As) is introduced into deep positions of the source and drain regions at a predetermined concentration (dosage) using ion implantation technique.

Likewise, in the P-type MOSFET region, using the gate electrode layer 209 and the gate sidewall insulation film 213 as a mask, impurities are introduced so that the above P-type deep junction regions 215a and 215b can be formed at the positions of the source and drain regions. In this case, although is not specially illustrated, in the P-type MOSFET region, boron (B) is introduced into deep positions of the source and drain regions at a predetermined concentration (dosage) using ion implantation technique.

Thereafter, heat treatment (anneal process) is carried out so that impurities of the above N-type deep junction regions 214a; 214b and P-type deep junction regions 215a; 215b can be activated.

In the process of forming the gate sidewall insulation films 212 and 213, the aluminum oxide film (gate insulating film) 202 existing on the source and drain regions are removed by etching so that an opening can be formed. By doing so, electric connection with conductive materials is made.

As shown in FIG. 8C, in the N-type MOSFET region, a cobalt silicide (CoSi) layer 216 is formed on the gate electrode layer 208 and the surface layer of the source and drain regions (N-type deep junction regions 214a; 214b) using salicide technique. Likewise, in the P-type MOSFET region, a cobalt silicide (CoSi) layer 217 is formed on the gate electrode layer 209 and the surface layer of the source and drain regions (P-type deep junction regions 215a; 215b). In this manner, the FET structure of CMOS transistors can be completed.

Here, in the N-type MOSFET region, the gate electrode layer is provided with the titanium nitride film as the metal gate layer. On the other hand, in the P-type MOSFET region, the gate electrode layer is provided with the tungsten nitride film as the metal gate layer. As described above, according to the conventional technique, in the N-type and P-type MOSFET regions, different materials selected from refractory metals and refractory metal nitrides are mainly used. This is because the work function value of materials for forming the metal gate layer is considered so that the difference between threshold voltages is given.

According to the conventional method of manufacturing semiconductor devices, in the gate electrode layer, it is easy to partially process the polycrystalline silicon film using the above-mentioned dry etching technique. However, in the process of etching materials of the metal gate layer (titanium nitride film 203, tungsten nitride film 205) such as refractory metal materials and refractory nitride films, the following problems arise.

That is, as seen from FIG. 8C, in the N-type MOSFET region, the gate electrode layer 208 is formed into the multi-layer film comprising the polycrystalline silicon film 206, tungsten nitride film 205 and titanium nitride film 203. On the other hand, in the P-type MOSFET region, the gate electrode layer 209 is formed into the multi-layer film comprising the polycrystalline silicon film 206 and the tungsten nitride film 205. Thus, the gate electrode layer structure differs in the N-type and P-type MOSFET regions; for this reason, it is difficult to simultaneously process and form each gate electrode layer in both regions by dry etching technique.

In such a case, particularly, when forming MOSFETs having different threshold voltage in each region based on circuit design conditions, the manufacturing process becomes complicate in accordance with the kind of the threshold voltages. As a result, this is a factor of reducing efficiency in production process.

In addition, in the N-type MOSFET region, it is difficult to accurately etch the titanium nitride film 203 in a state of keeping sufficient etching selectivity between the aluminum oxide film ($Al_2O_3$) 202 forming the gate insulating film and the titanium nitride film 203. In the N-type MOSFET region, the same problem as above arises between the tungsten nitride film 205 and the aluminum oxide film 202 forming the gate insulating film. This is a factor of reducing processing accuracy in each gate electrode layer and the gate insulating film.

With the conventional method of manufacturing semiconductor devices, it is possible to readily and accurately etch part of polycrystalline silicon. However, as described before, in the process of forming the metal gate layers (refractory metal, refractory nitride films, etc.), there is a problem that etching accuracy reduces and efficiency in production process is hindered. In particular, when forming MOSFETs having different threshold voltage in each region in accordance with circuit design conditions, the manufacturing process becomes complicate, and also, processing accuracy reduces.

BRIEF SUMMARY OF THE INVENTION

According to an aspect of the present invention, there is provided a semiconductor device comprising a semiconductor substrate; a gate insulating film formed on the semiconductor substrate; a gate electrode layer formed on the gate insulating film; source and drain regions formed at both sides of the gate electrode layer; and a channel region between the source and drain regions, wherein the gate electrode layer comprises a polycrystalline silicon layer and a metal layer formed between the gate insulating film and the polycrystalline silicon layer, and the metal layer has an electron density of $1.0 \times 10^{21}$ atoms/cm$^3$ or more.

According to another aspect of the present invention, there is provided a method of manufacturing a semiconductor device, comprising forming a gate insulating film on a semiconductor substrate; forming a polycrystalline silicon film on the gate insulating film; introducing a metal material into a predetermined region of the polycrystalline silicon film at an amount of the solid soluble limit or more; etching the polycrystalline silicon film to form, on the gate insulating film, a polycrystalline silicon gate layer to which the metal material is introduced, the polycrystalline silicon gate layer forming part of a gate electrode layer; forming source and drain regions at both sides of the polycrystalline silicon gate layer; and performing heat treatment to separate the metal material from the polycrystalline silicon gate layer to form a metal material segregation layer by the segregated metal material between the gate insulating film and the polycrystalline silicon gate layer.

According to a further aspect of the present invention, there is provided a method of manufacturing a semiconductor device, comprising forming a gate insulating film on a semiconductor substrate; forming a polycrystalline silicon film on the gate insulating film; introducing a first metal material into a first region of the polycrystalline silicon film at an amount of the solid soluble limit or more; introducing a second metal material into a second region of the polycrystalline silicon film at an amount of the solid soluble limit or more; etching the polycrystalline silicon film to form, on the gate insulating film, a first polycrystalline silicon gate layer to which the first metal material is introduced and a second polycrystalline silicon gate layer to which the second metal material is introduced, the first polycrystalline silicon gate layer forming part of a first gate electrode layer and the second polycrystalline silicon gate layer forming part of a second gate electrode layer; forming source and drain regions at both sides of each of the first and second polycrystalline silicon gate layers; and performing heat treatment to separate the first metal material from the first polycrystalline silicon gate layer to form a first segregation layer by the segregated first metal material between the gate insulating film and the first polycrystalline silicon gate layer and separate the second metal material from the second polycrystalline silicon gate layer to form a second segregation layer by the segregated second metal material between the gate insulating film and the second polycrystalline silicon gate layer.

DETAILED DESCRIPTION OF THE INVENTION

An embodiment of the present invention will be described below in detail with reference to FIGS. 1A to 1C through FIG. 5. A method of manufacturing CMOS transistors will be described herein as an example. More specifically, in N-type and P-type MOSFET regions, the work function value of each gate electrode layer in particular, portions equivalent to metal gate layers is controlled so that a predetermined threshold voltage can be given.

FIGS. 1A to 1C to FIG. 5 show cross-sectional views in the direction vertical to the lengthwise direction of gate electrode layers in N-type and P-type MOSFET regions.

Figure 1A:
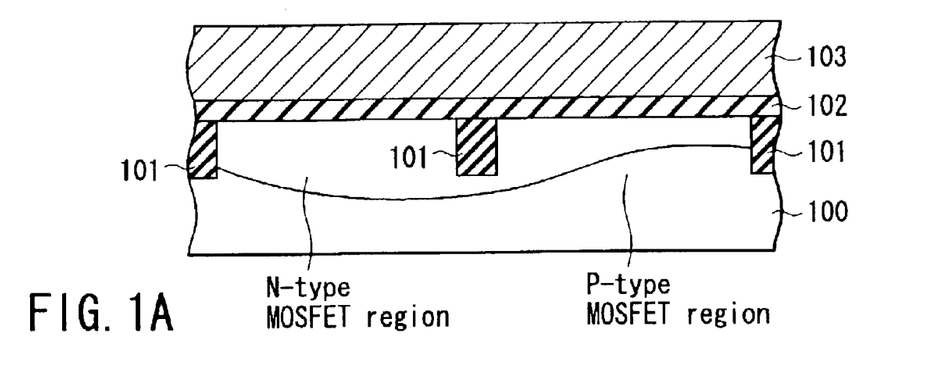
FIG. 1A to FIG. 1C are cross-sectional views showing a manufacturing process of semiconductor devices according to an embodiment of the present invention.

As illustrated in FIG. 1A, a shallow trench isolation region 101 is formed on a silicon substrate 100 with a predetermined interval using known STI (Shallow Trench Isolation) technique. Thereafter, in this state, an aluminum oxide film ($Al_2O_3$ film) 102 and a polycrystalline silicon film 103 are successively formed.

In the embodiment, each interval between the isolation regions 101 is used as a device forming region where a semiconductor device such as N-type or P-type MOS transistor is formed. As seen from FIG. 1A, the left side is an N-type MOSFET region; on the other hand, the right side is a P-type MOSFET region.

In the embodiment, the aluminum oxide film ($Al_2O_3$ film) 102 is used as the material for forming the gate insulating film of the N-type and P-type MOSFETs, and formed on the silicon substrate 100 so as to have a thickness of about 2 nm. The polycrystalline silicon film 103 is used as a material of the gate electrode layer, and formed so as to have a thickness of about 50 nm. In this case, it is desirable that the above polycrystalline silicon film 103 is formed in a state of containing impurities such as phosphorus (P). Thus, before forming patterns using ion implantation technique, impurities are introduced into portion forming the gate electrode layer of the polycrystalline silicon film 103, and thereby, the manufacturing process can be simplified.

Figure 1B:
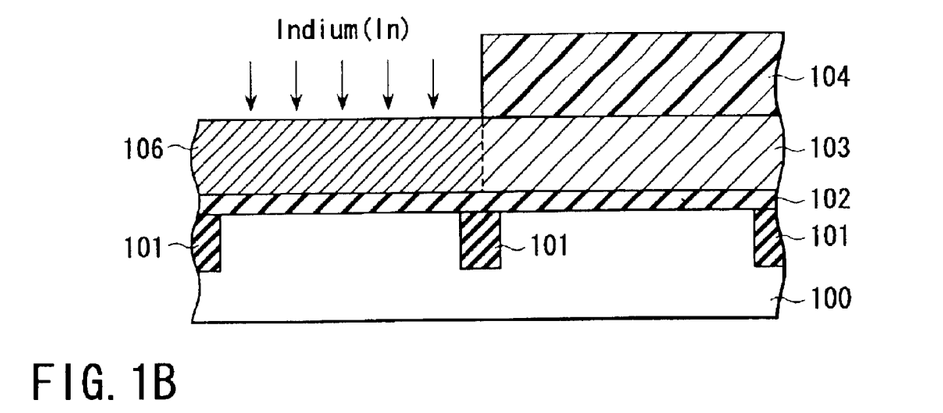
Figure 1C:
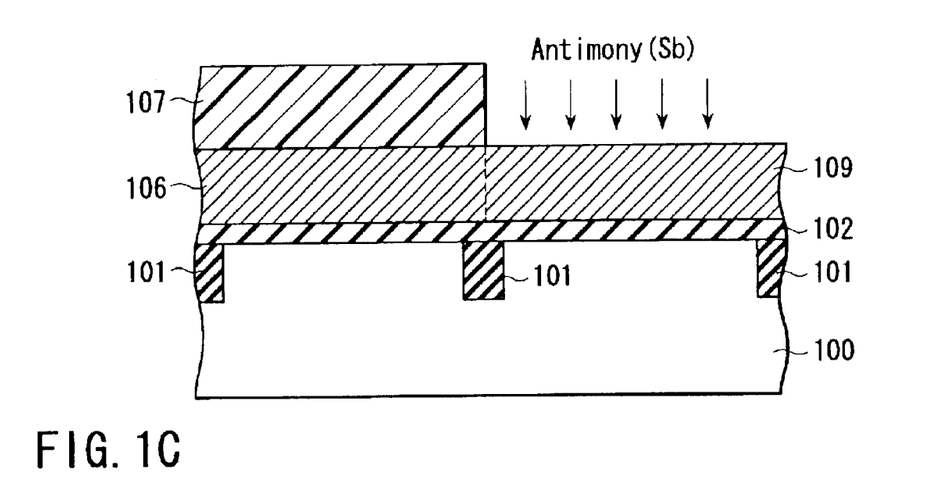

A predetermined amount of metal material is introduced into the polycrystalline silicon film 103 in each of the N-type and P-type MOSFET regions using lithography and ion implantation techniques.

As depicted in FIG. 1B, the P-type MOSFET region is covered with a photo resist film 104. In this state, using ion implantation technique, indium (In) is introduced into the polycrystalline silicon film 103 in the N-type MOSFET region so that a polycrystalline silicon film 106 (containing indium (In)) can be formed. Thereafter, the photo resist film 104 is removed.

In this case, preferably, the amount of indium (In) contained in the polycrystalline silicon film 106 is more than the solid soluble limit in silicon. The above Indium (In) has a solid soluble limit of about 1E18 (=$1.0 \times 10^{18}$) atoms/$cm^3$ in silicon. In the embodiment, the indium (In) 105 is introduced into the polycrystalline silicon film 103 in the following manner using ion implantation technique. That is, the indium (In) is controlled so that the dosage can be set more than 1 E21 (=$1.0 \times 10^{21}$) atoms/$cm^3$ when is made average in the polycrystalline silicon film 106 after introduction. According to one example of the embodiment, the indium (In) is introduced into the polycrystalline silicon film 103 so that the dosage can controlled to about 1E21 (=$1.0 \times 10^{21}$) atoms/$cm^3$ when made average in the polycrystalline silicon film 106 after introduction.

As shown in FIG. 1C, the N-type MOSFET region is covered with a photo resist film 107. Using ion implantation technique, antimony (Sb) is introduced into the polycrystalline silicon film 103 in the N-type MOSFET region so that a polycrystalline silicon film 109 (containing antimony (Sb)) can be formed. Thereafter, the photo resist film 107 is removed.

In this case, preferably, the amount of antimony (Sb) contained in the polycrystalline silicon film 109 is more than the solid soluble limit in silicon. The above antimony (Sb) has a solid soluble limit of about 1E18 (=$1.0 \times 10^{18}$) atoms/$cm^3$ in silicon. In the embodiment, the antimony (Sb) is introduced into the polycrystalline silicon film 103 in the following manner using ion implantation technique. That is, the indium (In) is controlled so that the dosage can be set more than 1E21 (=$1.0 \times 10^{21}$) atoms/$cm^3$ when is made average in the polycrystalline silicon film 109 after introduction. According to one example of the embodiment, the antimony (Sb) 108 is introduced into the polycrystalline silicon film 103 so that the dosage can controlled to about 1E21 (=$1.0 \times 10^{21}$) atoms/$cm^3$ when made average in the polycrystalline silicon film 109 after introduction.

In the embodiment, in the process of introducing the metal material, there is a need of preventing degradation to the gate insulating film when the metal material reaches there. Thus, in this case, ion implantation acceleration voltage introduced to the polycrystalline silicon film 103 must be set to a proper value. If ion implantation technique is employed, the value of acceleration voltage applied to impurities determines the position (depth) where introduced impurities reach in the film. According to the embodiment, in the depth direction of the polycrystalline silicon film 103, the peak value (=Rp) of concentration distribution of the metal material is set so as to reach the polycrystalline silicon film 103 at least. Preferably, in the depth direction of the polycrystalline silicon film 103, when the concentration distribution of the metal material approximates to Gaussian distribution, the following condition is set. That is, Rp+6.0×ΔRp (Rp: peak value, ΔRp: standard deviation) is set to a value less than the thickness of the polycrystalline silicon film 103. The above conditions are set, and thereby, the indium (In) and antimony (Sb) are not implanted until they reach the gate insulating film (e.g., aluminum oxide film ($Al_2O_3$) 102); therefore, degradation can be prevented.

Figure 2A:
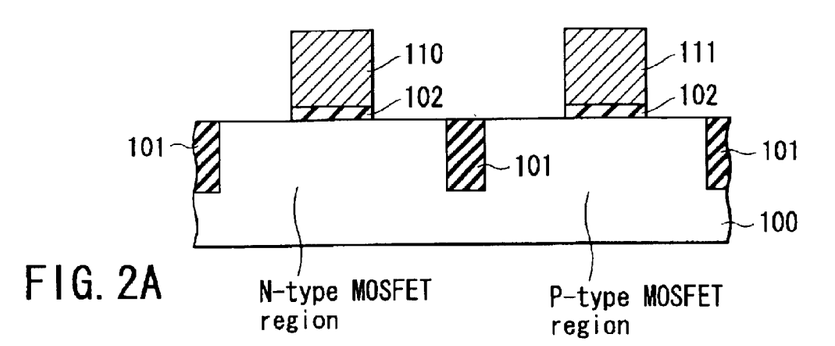
FIG. 2A to FIG. 2C are cross-sectional views showing a manufacturing process of semiconductor devices according to the embodiment of the present invention.

The polycrystalline silicon films 106 and 109 are simultaneously processed using lithography and etching techniques so that polycrystalline silicon gate layers 110 and 111 can be formed in the N-type and P-type MOSFET regions, respectively, as shown in FIG. 2A. Thereafter, thermal phosphoric acid treatment is carried out, and then, the aluminum oxide film 102 is removed so that it remains as a gate insulating film under the polycrystalline silicon gate layers 110 and 111.

Figure 2B:
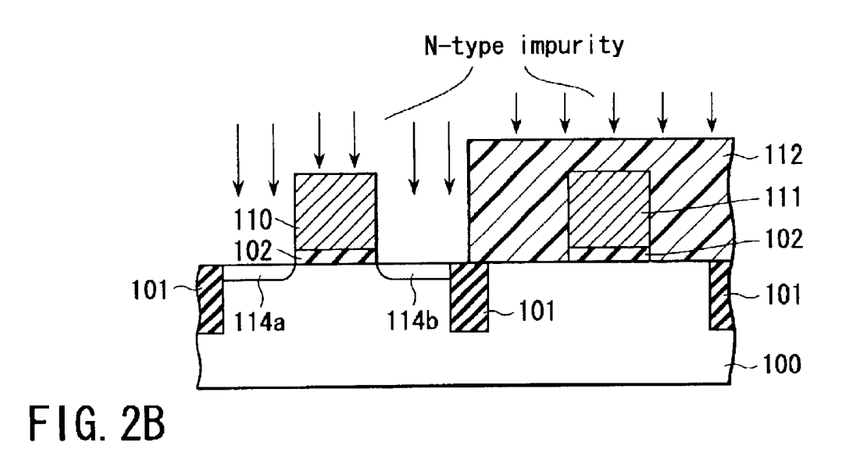
Figure 2C:
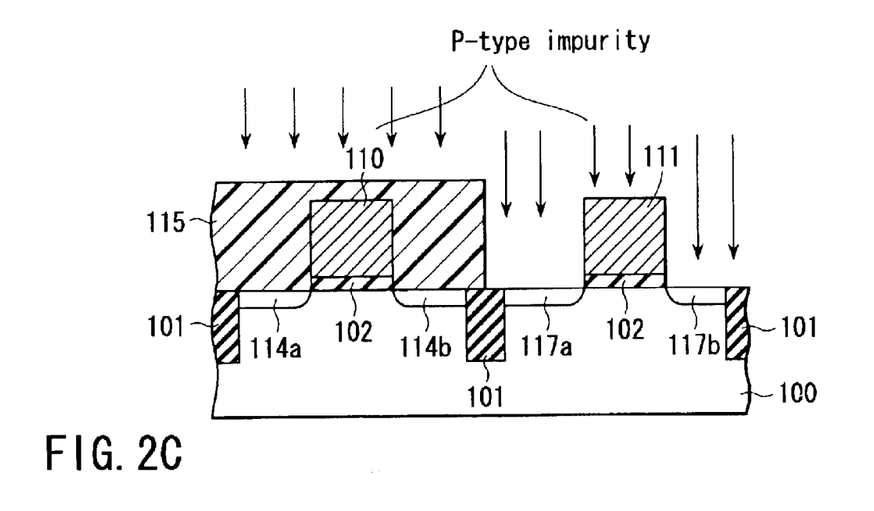

Using the polycrystalline silicon gate layers 110 and 111 as a mask, impurities are introduced into the N-type and P-type MOSFET regions by ion implantation technique.

The P-type MOSFET region is coated with a photo resist film 112 using lithography technique. Thereafter, as seen from FIG. 2B, in the N-type MOSFET region, N-type impurities (phosphorus (P) or arsenic (As)) are introduced using the polycrystalline silicon gate layer 110 as a mask by ion implantation technique. By doing so, N-type shallow junction regions 114a and 114b are formed at positions where the source and drain regions are formed. Thereafter, the photo resist film 112 is removed using mixed solution of sulfuric acid and hydrogen peroxide water.

Likewise, the N-type MOSFET region is coated with a photo resist film 115 using lithography technique. Thereafter, as seen from FIG. 2C, in the P-type MOSFET region, P-type impurities (boron (B)) are introduced using the polycrystalline silicon gate layer 111 as a mask by ion implantation technique. By doing so, P-type shallow junction regions 117a and 117b are formed at positions where the source and drain regions are formed. Thereafter, the photo resist film 115 is removed using mixed solution of sulfuric acid and hydrogen peroxide water.

In the above state, heat treatment (anneal process) of, for example, about 900° C. is carried out so that each impurity contained in the above N-type shallow junction regions 114a; 114b and P-type shallow junction regions 117a; 117b can be activated.

Figure 3A:
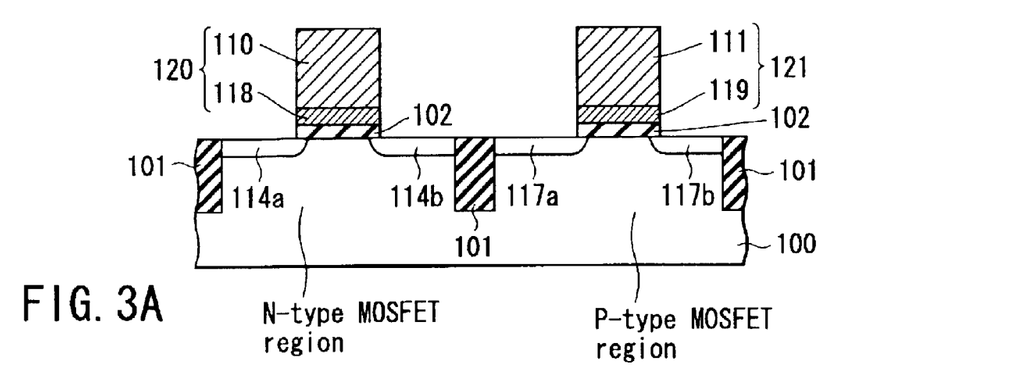
FIG. 3A to FIG. 3C are cross-sectional views showing a manufacturing process of semiconductor devices according to the embodiment of the present invention.

In the embodiment, during the above heat treatment, indium (In) contained in the polycrystalline silicon gate layer 110 is segregated in the N-type MOSFET region so that an indium (In) segregation layer 118 can be formed as shown in FIG. 3A. Simultaneously, antimony (Sb) contained in the polycrystalline silicon gate layer 111 (polycrystalline silicon film) is segregated in the P-type MOSFET region so that an antimony (Sb) segregation layer 119 can be formed.

In this case, the above indium (In) passes through the grain boundary of the polycrystalline silicon gate layer 110. Thereafter, the indium (In) is segregated at the interface between the aluminum oxide film ($Al_2O_3$) 102 (gate insulating film) and the polycrystalline silicon gate layer 110 so as to have a thickness of about 1 nm. Likewise, the above antimony (Sb) passes through the grain boundary of the polycrystalline silicon gate layer 111. Thereafter, the indium (In) is segregated at the interface between the aluminum oxide film ($Al_2O_3$) 102 (gate insulating film) and the polycrystalline silicon gate layer 111 so as to have a thickness of about 1 nm.

In this manner, in the N-type MOSFET region, the indium (In) segregation layer 118 having a thickness of 1 nm is formed as a metal gate layer at the interface between the aluminum oxide film 102 (gate insulating film) and the polycrystalline silicon gate layer 110. On the other hand, in the P-type MOSFET region, the antimony (Sb) segregation layer 119 having a thickness of 1 nm is formed as a metal gate layer at the interface between the aluminum oxide film 102 (gate insulating film) and the polycrystalline silicon gate layer 111. These metal segregation layers need to contain an electron density of about $1.0 \times 10^{21}/cm^3$ or more at room temperature (100° C. or less).

In the manner described above, as illustrated in FIG. 3A, the N-type MOSFET region is formed with a gate electrode layer 120, which comprises the polycrystalline silicon gate layer 110 and the indium (In) segregation layer 118. On the other hand, the P-type MOSFET region is formed with a gate electrode layer 121, which comprises the polycrystalline silicon gate layer 111 and the antimony (Sb) segregation layer 119.

As is known, indium (In) has a work function value of about 4.1 eV; on the other hand, antimony (Sb) has a work function value of about 4.7 eV. Therefore, the indium (In) segregation layer 118 and the antimony (Sb) segregation layer 119 are used as each metal gate layer suitable for the N-type and P-type MOSFET regions, respectively.

In the embodiment, as described before, in the N-type MOSFET region, the aluminum oxide film 102 (gate insulating film) is partially removed. Thereafter, the N-type impurities are directly introduced to the positions of the source and drain regions so that N-type shallow junction regions 114a and 114b can be formed. Likewise, in the P-type MOSFET region, the P-type impurities are directly introduced to the positions of the source and drain regions so that P-type shallow junction regions 117a and 117b can be formed.

According to the embodiment, since the impurities are directly introduced to the source and drain regions, it is possible to reduce energy required for ion implantation technique as compared with the conventional case. Therefore, during heat treatment, the above N-type shallow junction regions 114a; 114b and P-type shallow junction regions 117a; 117b can be accurately formed in a manner that their ranges do not extend more than necessity.

Figure 3B:
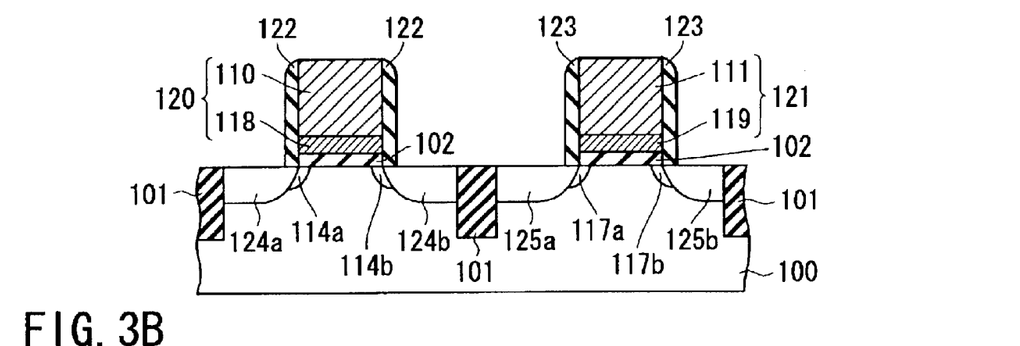

As shown in FIG. 3B, gate sidewall insulation film 122 is formed along the sidewall of the polycrystalline silicon gate layer 110 and the indium (In) segregation layer 118, using silicon nitride film and the like. Simultaneously, gate sidewall insulation film 123 is formed along the sidewall of the polycrystalline silicon gate layer 111 and the antimony (Sb) segregation layer 119, using silicon nitride film and the like. Thereafter, in the above state, N-type deep junction regions 124a; 124b and P-type deep junction regions 125a; 125b at the source and drain regions in the N-type and P-type MOSFET regions, respectively.

First, the P-type MOSFET region is coated with a photo resist film. Thereafter, in the N-type MOSFET region, impurities are introduced using the polycrystalline silicon gate layer 110 and the gate sidewall insulation film 122 so that N-type deep junction regions 124a and 124b can be formed at the source and drain regions. In this case, although is not specially illustrated, in the N-type MOSFET region, phosphorus (P) or arsenic (As) is introduced into the deep position of the source and drain regions at a predetermined concentration (dosage) using ion implantation technique. Thereafter, the photo resist film coated on the P-type MOSFET region is removed.

Likewise, the N-type MOSFET region is coated with a photo resist film. In this state, in the P-type MOSFET region, impurities are introduced using the polycrystalline silicon gate layer 111 and the gate sidewall insulation film 123 so that P-type deep junction regions 125a and 125b can be formed at the source and drain regions. In this case, although is not specially illustrated, in the P-type MOSFET region, boron (B) is introduced into the deep position of the source and drain regions at a predetermined concentration (dosage) using ion implantation technique.

Thereafter, heat treatment is carried out so that impurities of the above N-type deep junction regions 124a; 124b and P-type deep junction regions 125a; 125b can be activated.

Independently from the above-mentioned case, an opening may be formed in the following manner. That is, in the process of forming the gate sidewall insulation films 122 and 123, the aluminum oxide film 102 (gate insulating film) existing on the source and drain regions is removed by etching.

Figure 3C:
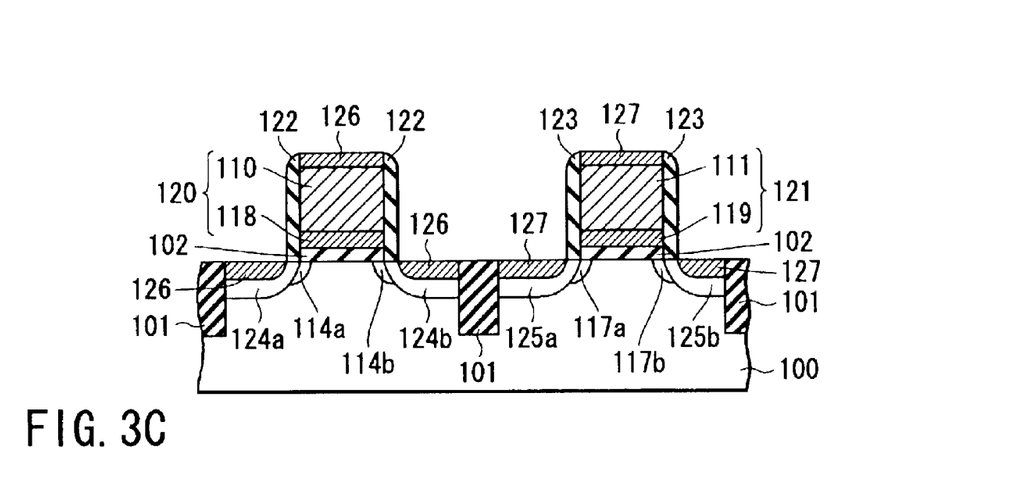

As seen from FIG. 3C, in the N-type and P-type MOSFET regions, cobalt silicide (CoSi) layers 126 and 127 are formed using salicide technique. The above cobalt silicide (CoSi) layers 126 and 127 are formed on the polycrystalline silicon gate layers 110; 111 and the surface layer of the source drain regions (N-type and P-type deep junction regions 124a; 124b and 125a; 125b), respectively. In this manner, the FET structure of CMOS transistors is completed.

As described above, according to the present embodiment, part of the gate electrode layer is formed with an N-type MOSFET, which includes the indium (In) segregation layer 118 as the metal gate layer. In addition, part of the gate electrode layer is formed with a P-type MOSFET, which includes the antimony (Sb) segregation layer 119 as the metal gate layer. In this manner, the FET structure of CMOS transistors is completed. In the CMOS transistors having the above FET structure, no depletion layer is formed in each gate electrode layer during operation. Therefore, the above CMOS transistors can function as semiconductor devices having high drive power and high performance.

In addition, according to the present embodiment, the polycrystalline silicon film is formed on the semiconductor substrate (e.g., silicon substrate 100) via the gate insulating film (e.g., aluminum oxide film ($Al_2O_3$) 102), using the gate electrode layer as the main material. Then, using ion implantation technique, metal materials (e.g., indium (In), antimony (Sb), etc.) are introduced into the predetermined region of the polycrystalline silicon film at the amount more than the solid soluble limit in silicon material. Thereafter, using dry etching technique, the polycrystalline silicon film portion is processed into gate electrode layer patterns (polycrystalline silicon gate layers 110 and 111). Subsequently, heat treatment is carried out so that metal gate layers (e.g., indium (In) segregation layer 118 and antimony (Sb) segregation layer 119) can be formed.

In this case, in the process of forming the gate electrode later patterns, known dry etching is carried out with respect to only polycrystalline silicon film, and thereby, patterns processed to a predetermined shape and dimension can be obtained. Therefore, etching selectivity with the gate insulating film (e.g., aluminum oxide film ($Al_2O_3$) 102) is sufficiently secured, and the polycrystalline silicon film is accurately and readily etched, so that the gate electrode layer pattern can be formed. In addition, metal segregation layers (e.g., indium (In) segregation layer 118 and antimony (Sb) segregation layer 119) can be simultaneously formed by heat treatment carried out to form the source and drain regions.

As seen from the above description, according to the embodiment, the use of conventional facilities for manufacturing apparatuses is possible when carrying out dry etching technique, heat treatment and ion implantation technique. Therefore, it is possible to greatly reduce the costs without carrying out complicate processes, and to readily and accurately manufacture high performance semiconductor devices including gate electrode layers having no depletion.

In the embodiment, as described before, heat treatment has been carried out in the process of forming N-type shallow junction regions 114a; 114b and P-type shallow junction regions 117a; 117b at the source and drain regions. Simultaneously, the indium (In) segregation layer 118 and the antimony (Sb) segregation layer 119 have been formed.

According to the embodiment, heat treatment may be carried out in the following manner. For example, patterns of the polycrystalline silicon gate layers 110 and 111 are formed (see FIG. 2A). Thereafter, as described above, before impurities are introduced into the shallow position of the source and drain regions using ion implantation technique, heat treatment of about 900° C. is carried out once. Then, the indium (In) segregation layer 118 and the antimony (Sb) segregation layer 119 may be formed between the aluminum oxide film 102 (gate insulating film) and the polycrystalline silicon gate layers 110; 111, respectively.

In the embodiment, preferably, it is effective to set the thickness of the indium (In) segregation layer 118 formed at the interface between the polycrystalline silicon gate layer 110 and the aluminum oxide film 102 (gate insulating film) to 5 nm or less. Likewise, preferably, it is effective to set the thickness of the antimony (Sb) segregation layer 119 formed at the interface between the polycrystalline silicon gate layer 111 and the aluminum oxide film 102 (gate insulating film) to 5 nm or less. Further preferably, it is effective to set each thickness of the above indium (In) segregation layer 118 and antimony (Sb) segregation layer 119 to 1 nm or less equivalent to several atomic layers. As described above, each thickness of the above indium (In) segregation layer 118 and antimony (Sb) segregation layer 119 is made thin, and thereby, component fluidity can be suppressed.

Therefore, in the embodiment, the dosage (concentration) of indium (In) and antimony (Sb) and the temperature of heat treatment carried out to deposit these metal elements are controlled. The following is a description on the thickness of the indium (In) segregation layer. The indium (In) has a melting point of 160° C. relatively near to room temperature as single element. Thus, if the thickness exceeds 5 nm, the indium (In) segregation layer considerably appears properties as indium (In) single element. For this reason, even if low temperature heat treatment near to room temperature is carried out, there is a possibility that indium (In) flows. Therefore, according to the embodiment, the thickness of the indium (In) segregation layer 118 is set to 5 nm or less, and thereby, indium (In) acts the following manner. That is, bonding strength acts between the gate insulating film (aluminum oxide film ($Al_2O_3$) 102) existing under the indium (In) segregation layer 118 and the polycrystalline silicon film (polycrystalline silicon gate layers 110; 111) exiting above the indium (In) segregation layer 118. Thereafter, the property as (indium (In)) single element is gradually reduced. In this case, the melting point of the indium (In) segregation layer 118 becomes higher temperature; therefore, indium is hard to flow. In addition, the thickness of the indium (In) segregation layer 118 is reduced to 1 nm or less (equivalent to several atomic layers 9, and thereby, the melting point of the indium (In) segregation layer 118 greatly increases. Therefore, it is possible to securely prevent the flow of indium (In). Thus, in the embodiment, the thickness of the indium (In) segregation layer 118 may be varied considering the influence by heat treatment.

Likewise, the thickness of the antimony (Sb) segregation layer 119 is controlled based on the same reason as above.

In the above embodiment, indium (In) and antimony (Sb) are used as the metal material introduced into the polycrystalline silicon gate layers 110 and 111; however, the metal material introduced thereto is not limited to these indium (In) and antimony (Sb). Metal materials other than above metals may be of course used so long as they form metal segregation layers containing electron density of about $1.0 \times 10^{21}/cm^3$ or more are formed at room temperature (100° C. or less). For example, gallium (Ga), thulium (Tl), tin (Sn), lead (Pb), bismuth (Bi), selenium (Se) and tellurium (Te) may be used. If the above metal elements are used, as described before, these metal elements are introduced using ion implantation technique after the polycrystalline silicon film 103 is formed on the silicon substrate 100. Thereafter, heat treatment is carried out so that metal segregation layers can be formed. In addition, these metal element films are chemically vapor-deposited on the polycrystalline silicon film, and thereafter, heat treatment is carried out at the above temperature range so that metal segregation layers can be formed at the same -position as above.

The above metal elements have the following solid work function values. That is, gallium (Ga) is 4.3 eV, thulium (Tl) is 3.8 eV, tin (Sn) is 4.4 eV, lead (Pb) is 4.3 eV, bismuth (Bi) is 4.3 eV, selenium (Se) is 5.9 eV and tellurium (Te) is 5.0 eV. As is known, metal materials having the work function value of 4.6 eV or less are suitable for the gate electrode layer of N-type MOSFETs. On the other hand, metal materials having the work function value of 4.6 eV or more are suitable for the gate electrode layer of P-type MOSFETs. Therefore, of the above metal elements, metal materials having the work function value of 4.6 eV or less are effectively used as the gate electrode layer of N-type MOSFETs in the same manner as above. On the other hand, metal materials having the work function value of 4.6 eV or more are effectively used as the gate electrode layer of P-type MOSFETs in the same manner as above.

The present embodiment has described the method of forming metal gate layers having two different work functions corresponding to the N-type and P-type MOSFETs in order to form CMOS transistors. According to the embodiment, it is possible to set threshold voltages suitable for each of the N-type and P-type MOSFETs without requiring especially complicate process.

In addition to above, according to the embodiment, in each of the N-type and P-type MOSFETs, it is possible to form gate electrode layers having further different work functions. In this case, metal gate layers having three different work functions can be formed on the same semiconductor substrate. For example, a gate electrode layer including a gallium (Ga) segregation layer can be formed as the metal gate layer on the silicon substrate 100, in addition to gate electrode layers including the indium (In) segregation layer 118 and the antimony (Sb) segregation layer 119.

Figure 4A:
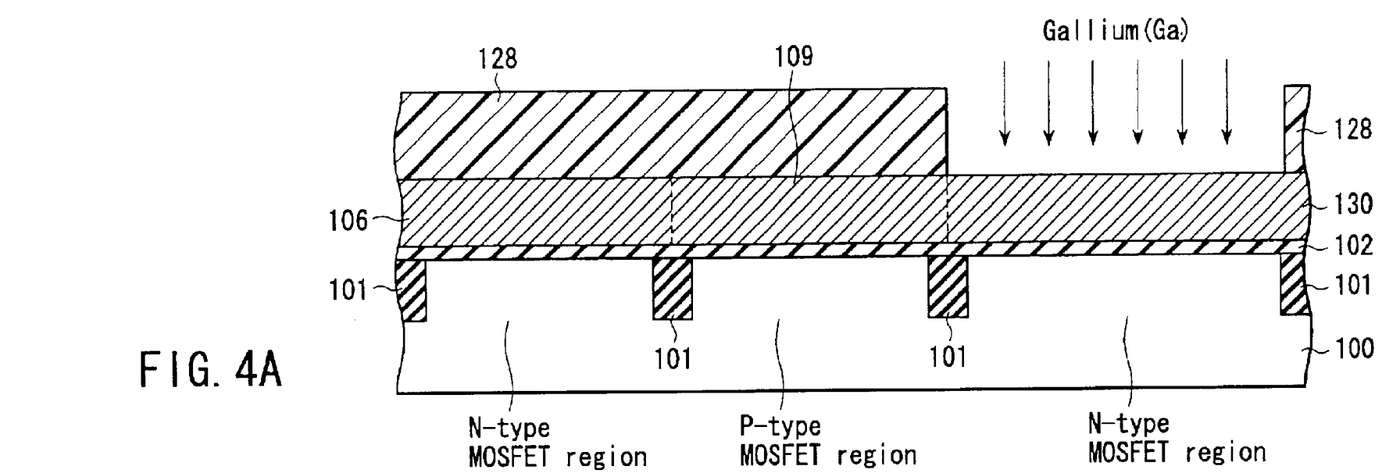
FIG. 4A and FIG. 4B are cross-sectional views showing a manufacturing process of semiconductor devices according to a modification of the embodiment of the present invention.
Figure 4B:
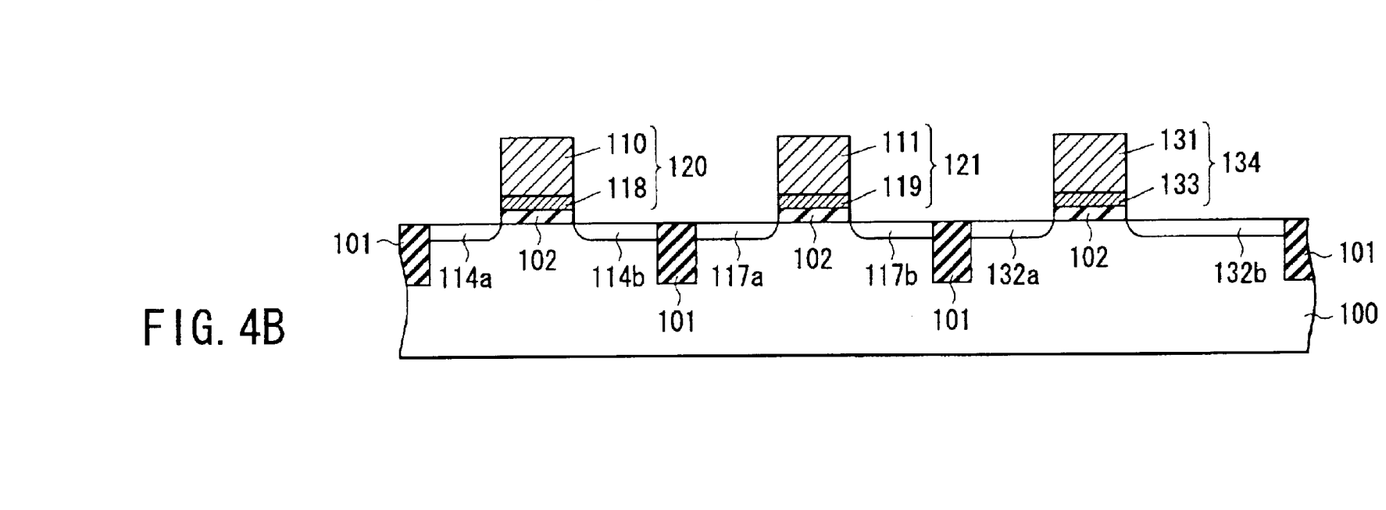

As described above, gallium (Ga) solid has the work function of about 4.3 eV. Using the manufacturing method of the embodiment, as shown in FIG. 4A and FIG. 4B, a gate electrode layer including a gallium (Ga) segregation layer can be formed. By doing so, it is possible to form another MOSFET including a metal gate layer having work function of 4.3 eV. If the gate electrode layer is applied to the N-type MOSFET, the following metal gate layer is obtained. That is, the metal gate layer has the work function of about 0.2 eV lager than the metal gate layer partially including the indium (In) segregation layer. Thus, an N-type MOSFET having high threshold voltage can be formed.

According to the above procedures, the gate electrode layer including the gallium (Ga) segregation layer (metal gate layer) can be formed in the N-type MOSFET region.

Here, the same reference numerals used in FIGS. 1A to 1C through FIGS. 3A to 3C are given to the portions identical to the above embodiment, and the details are omitted.

More specifically, as described before (see FIGS. 1A to 1C), in the N-type MOSFET region, indium (In) is introduced into the polycrystalline silicon film 103 so that the polycrystalline silicon film 106 (containing indium (In)) can be formed. Likewise, in the P-type MOSFET region, antimony (Sb) is introduced into the polycrystalline silicon film 103 so that the polycrystalline silicon film 109 (containing antimony (Sb)) can be formed.

As illustrated in FIG. 4A, the above polycrystalline silicon films 106 and 109 are coated with a photo resist film 128. In a predetermined N-type MOSFET region, gallium (Ga) is introduced using ion implantation technique so that a polycrystalline silicon film 130 (containing gallium (Ga)) can be formed.

In this case, the amount of gallium contained in the polycrystalline silicon film 130 may be set to the solid soluble limit or more in silicon, as described before.

As depicted in FIG. 4B, polycrystalline silicon gate layers 110, 111 and 131 are formed, and impurities are introduced so that N-type shallow junction regions 114a, 114b, 132a and 132b can be formed in the N-type MOSFET region. Likewise, impurities are introduced so that P-type shallow junction regions 117a and 117b can be formed in the P-type MOSFET region. In the process of activating the impurities contained in the above shallow junction regions, heat treatment is carried out so that indium (In) segregation layer 118, antimony (Sb) segregation layer 119 and gallium (Ga) segregation layer 133 can be simultaneously formed on the silicon substrate 100. In this case, the above segregation layers are formed so as to individually have a thickness of about 1 nm. In this manner, a gate electrode layer 134 comprising the polycrystalline silicon gate layer 131 and the gallium segregation layer 133 is formed on the silicon substrate 100, in addition to the gate electrode layers 120 and 121.

In this case, as described before, using dry etching technique such as RIE, the polycrystalline silicon films 106, 109 and 130 are etched to a predetermined shape and dimension. By doing so, the polycrystalline silicon gate layers 110, 111 and 131 can be formed. Thereafter, thermal phosphoric acid treatment is carried out, and the aluminum oxide film $(Al_2O_3)$ 102 is partially removed so that it remains as gate insulating film under the polycrystalline silicon gate layers 110, 111 and 131. Thereafter, in the N-type and P-type MOSFET regions, the polycrystalline silicon gate layers 110, 111, 131 and the aluminum oxide film 102 (gate insulating film) are used as a mask. In this state, impurities are introduced so that N-type shallow junction regions 114a, 114b, 132a and 132b and P-type shallow junction regions 117a and 117b can be formed. Thereafter, heat treatment is carried out at about 900° C. so that impurities contained in the above shallow junction regions can be activated. In this case, during heat treatment, indium (In) segregation layer 118, antimony (Sb) segregation layer 119 and gallium (Ga) segregation layer 133 can be simultaneously formed on the silicon substrate 100 so as to individually have a thickness of about 1 nm.

In this case, in the N-type and P-type MOSFET regions, the aluminum oxide film 102 (gate insulating film) is partially removed, and thereafter, N-type and P-type impurities are directly introduced into the source and drain regions. By doing so, as described before, it is possible to reduce energy required for ion implantation as compared with the conventional case. In addition, in the process of carrying out heat treatment, the above N-type shallow junction regions 114a, 114b, 132a, 132b and P-type shallow junction regions 117a, 117b can be accurately formed so that their ranges do not extend more than necessity.

In the manner described above, several N-type MOSFETs can be formed on the same semiconductor substrate. In this case, the N-type MOSFETs include a metal gate layer having the work function value of about 0.2 eV larger than the indium (In) segregation layer 118, and has different threshold voltages.

In addition to above, a gate electrode layer including a tellurium (Te) segregation layer is formed as one example. As described before, tellurium (Te) has a work function value of about 5.0 eV; therefore, it is suitable for P-type MOSFETs. Thus, P-type MOSFETs can be formed on the same semiconductor substrate. In this case, the P-type MOSFETs include a metal gate layer having the work function value of about 0.3 eV larger than the antimony (Sb) segregation layer 119, and has different threshold voltages. Consequently, it is possible to form CMOS transistors having two different threshold voltages in each of the N-type and P-type MOSFET regions.

Figure 5:
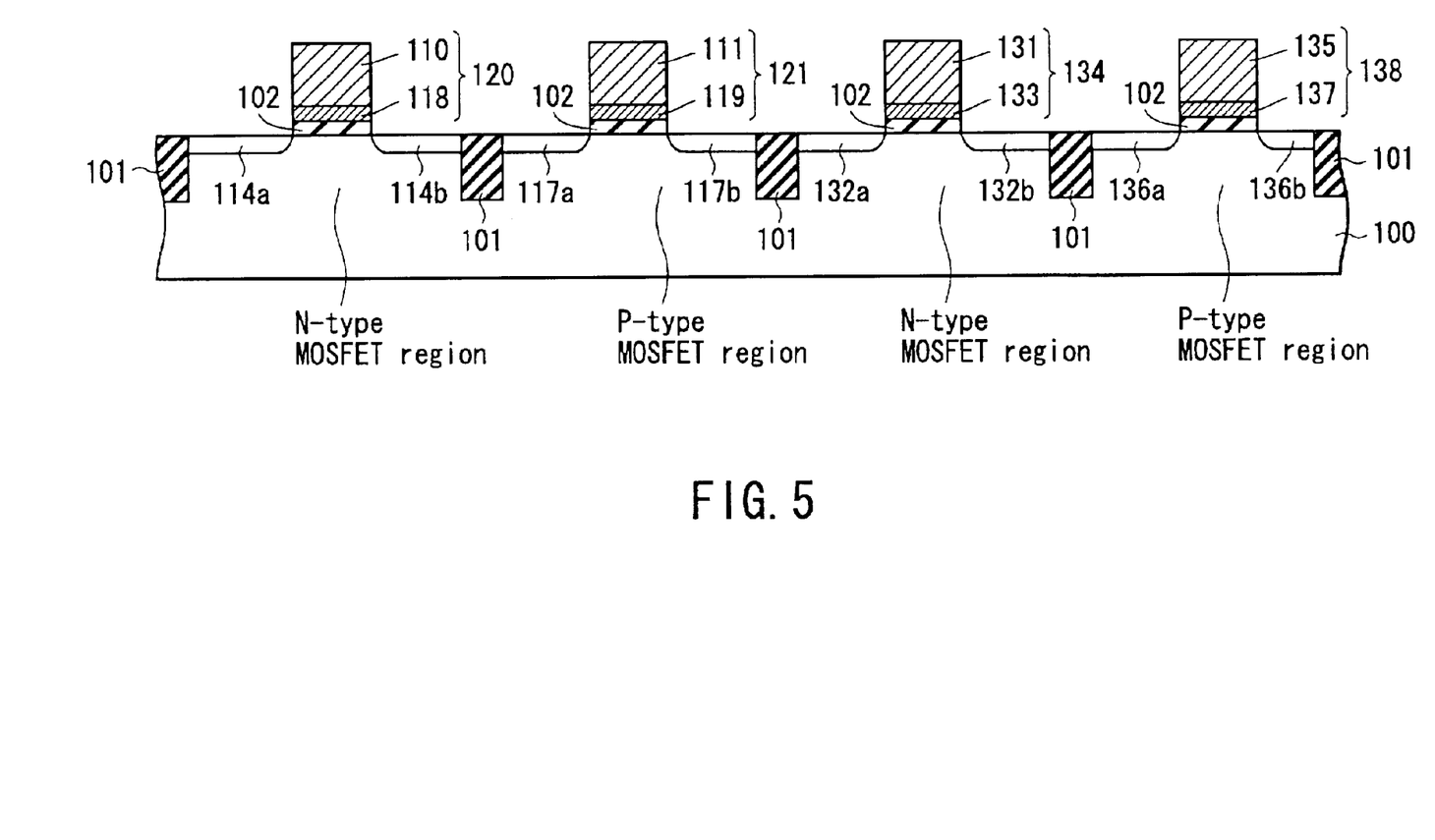
FIG. 5 is a cross-sectional view showing a manufacturing process of semiconductor devices according to a modification of the embodiment of the present invention.

More specifically, according to the procedures and conditions of the above embodiment, as illustrated in FIG. 5, a polycrystalline silicon gate layer 135, P-type shallow junction regions 136a and 136b are formed. Thereafter, in the process of activating impurities of the above shallow junction regions, heat treatment is carried out at 900° C. so that a tellurium (Te) segregation layer 137 having a thickness of 1 nm can be formed.

Thus, the indium (In), gallium (Ga), antimony (Sb) and tellurium (Te) segregation layers 118, 133, 119 and 137 can be formed on the same semiconductor substrate (e.g., silicon substrate 100) as four metal gate layers having different work functions. (In this case, each work function of the above metal gate layers is 4.1 eV, 4.3 eV, 4.7 eV and 5.0 eV.) Therefore, a gate electrode layer 138 comprising the polycrystalline silicon gate layer 135 and the tellurium (Te) segregation layer 137 can be formed in addition to the above gate electrode layers 120, 121 and 134. As a result, it is possible to form four kinds of MOSFETs having different threshold voltages. In this case, one of the above four MOSFETs is a low threshold voltage N-type MOSFET, another is a high threshold voltage N-type MOSFET, another is a low threshold voltage P-type MOSFET and another is a low threshold voltage P-type MOSFET. In this manner, a CMOS transistor having four MOSFETs having different threshold voltages can be formed on the same semiconductor substrate.

As seen from the above description, according to the present embodiment, in accordance with circuit design, it is possible to readily and accurately form several MOSFETs having different threshold voltage.

In addition, according to the present embodiment, the above two metal elements or more are combined regardless of N-type and P-type MOSFETs. By doing so, part of the gate electrode layer is formed with an alloy segregation layer, and a threshold voltage of each gate electrode layer may be finely controlled. In this case, in N-type and P-type MOSFET regions, several metal materials are introduced into a polycrystalline silicon film (e.g., polycrystalline silicon film 103) on gate insulating film (e.g., aluminum oxide film ($Al_2O_3$) 102). Thereafter, the above film is etched by dry etching technique, and thereafter, heat treatment is carried out so that an alloy segregation layer can be formed at the interface between polycrystalline silicon gate layers 110; 111 and the gate insulating film (e.g., aluminum oxide film ($Al_2O_3$) 102).

In the process of forming the above alloy segregation layer, several metal elements belonging to the same group (in periodic table) are introduced into the polycrystalline silicon film. By doing so, the work function can be set to the medium value of the above several metal elements. For instance, indium (In) and thallium (Tl) are introduced into the polycrystalline silicon film using known ion implantation technique. Thereafter, as described above, heat treatment is carried out so that an alloy segregation layer comprising indium (In) and thallium (Tl) can be formed. In this case, the alloy segregation layer has a work function value ranging from 3.8 to 4.1 eV; therefore, it is possible to form N-type MOSFETs having threshold voltages corresponding to the above value. In addition, the introduced amount of each metal element is controlled, and thereby, it is possible to continuously change the work function value of the alloy segregation layer and the threshold voltage value of MOSFETs.

In this case, regardless of N-type and P-type MOSFETs, the threshold voltage value can be readily and continuously fine-controlled in the gate electrode layer of each MOSFET. Therefore, it is possible to readily and accurately form MOSFETs having suitable threshold voltage, and to improve a degree of freedom in circuit design, as compared with the conventional case.

With the conventional technique, when several threshold voltages are given to each of the N-type and P-type MOSFETs, there is a need of carrying out the following process. That is, considering the work function value of the gate electrode layer, several metal materials (refractory metal film, refractory metal nitride film) must be formed in accordance with the kind of the threshold voltages. For this reason, the manufacturing process becomes complicate as described before. In addition, it is difficult to sufficiently secure etching selectivity of metal materials (refractory metal film, refractory metal nitride film) and gate insulating film. As a result, etching accuracy is reduced.

On the contrary, according to the present embodiment, the structure of the gate electrode layer is partially varied without employing especially complicate process as compared with the conventional manufacturing method. In addition, MOSFETs having different threshold voltages is accurately formed in the N-type and P-type MOSFET regions. Therefore, a degree of freedom can be improved in circuit design.

The present embodiment is applicable to various processes of manufacturing semiconductor devices. According to the embodiment, impurity concentration is varied, and thereby, it is possible to readily and accurately form MOSFETs having different threshold voltages without changing the structure of channel region as compared with the conventional technique. Therefore, high performance of semiconductor devices can be achieved.

In this case, a so-called SOI substrate (Silicon On Insulator substrate) is used, and thereby, remarkable effects can be obtained in the manufacture of semiconductor devices such as full depletion type MOSFETs. As is known, if the SOI substrate is used, transistor devices such as MOSFET are formed at a thin silicon layer of the surface layer, that is, a silicon active layer. The full depletion type MOSFET is operated in a state that the channel region surrounded by the source and drain regions is fully depleted. In this manner, the thickness in the depth direction of the channel region is increased, and the drive force of MOSFET is improved at low threshold voltage. Thus, if the full depletion type MOSFET is manufactured, in the SOI substrate, the thickness of the silicon active layer equivalent to the channel region is reduced to 50 nm or less.

In such a case, the impurity concentration of the channel region is finely controlled, and thereby, it is impossible to control the threshold voltage value. That is, in order to operate the full depletion type MOSFET in a state that the channel region is fully depleted, the upper limit inevitably exists in the impurity concentration of the channel region. As a result, the full depletion type MOSFET is merely operated at the concentration less than the above upper limit. In order to control the threshold voltage, it is necessary to change the work function value of the gate electrode layer. However, with the conventional technique, if gate electrode layers having different work function are formed in N-type and P-type MOSFETs, the manufacturing process becomes complicate, and processing accuracy of the gate electrode layer by etching is reduced, as described before. As a result, a problem arises when forming the full depletion type MOSFET having different threshold voltage on the same SOI substrate.

On the contrary, the method of the present embodiment is employed, and thereby, it is possible to readily and accurately form gate electrode layers having different work function on the same SOI substrate. Therefore, the full depletion type MOSFET having different threshold voltage can be readily and accurately formed on the same SOI substrate. In addition, a degree of freedom can be also improved in circuit design.

The present embodiment is not limited to the case where the SOI substrate is used; in this case, the same effects as above can be obtained even if it is applied to another full depletion type transistors. For example, the present embodiment is applied to MOSFETs including two gate electrode layers, a so-called double-gate electrode layer, and the MOSFET can be operated as the full depletion type MOSFET. The MOSFET including the double-gate electrode layer is in the same potential state, and thin semiconductor materials (e.g., silicon, polycrystalline silicon) are interposed between a pair of gate electrode layers formed at the position facing each other. In this case, in order to change the threshold value of MOSFETs, there is a need of changing the work function value of the gate electrode layer. Thus, the present embodiment is applied, and thereby, it is possible to readily and accurately form gate electrode layers having different work function on the same semiconductor substrate. Consequently, the full depletion type MOSFET having different threshold voltage can be readily and accurately formed on the same semiconductor substrate. In addition, a degree of freedom can be also improved in circuit design.

In the present embodiment, various modifications can be made without departing from the scope of the present invention.

According to the embodiment, part of the gate electrode is formed with metal segregation layers without employing complicate manufacturing process, and thereby, the threshold voltage value of the semiconductor device can be changed. Therefore, it is possible to readily change the threshold voltage value of individual semiconductor devices, and thus, to improve a degree of freedom in circuit design.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a gate insulating film formed on the semiconductor substrate;
a gate electrode layer formed on the gate insulating film;
source and drain regions formed at both sides of the gate electrode layer; and
a channel region between the source and drain regions, wherein
the gate electrode layer comprises a polycrystalline silicon layer and a metal layer formed between the gate insulating film and the polycrystalline silicon layer, and
the metal layer has an electron density of $1.0 \times 10^{21}$ atoms/cm$^3$ or more.

2. A semiconductor device according to claim 1, wherein the metal layer is made of a material selected from indium (In), gallium (Ga), thallium (Tl), tin (Sn), lead (Pb), antimony (Sb), bismuth (Bi), selenium (Se), and tellurium (Te).

3. A semiconductor device according to claim 1, wherein the metal layer is made of a metal alloy of those selected from indium (In), gallium (Ga), thallium (Tl), tin (Sn), lead (Pb), antimony (Sb), bismuth (Bi), selenium (Se), and tellurium (Te).

4. A semiconductor device according to claim 1, wherein the metal layer has a thickness of 5 nm or less.

5. A semiconductor device according to claim 2, wherein the metal layer has a thickness of 5 nm or less.

6. A semiconductor device according to claim 1, wherein the metal layer has a thickness of 1 nm or less.

7. A semiconductor device according to claim 2, wherein the metal layer has a thickness of 1 nm or less.

8. A method of manufacturing a semiconductor device, comprising:
forming a gate insulating film on a semiconductor substrate;
forming a polycrystalline silicon film on the gate insulating film;
introducing a metal material into a predetermined region of the polycrystalline silicon film at an amount of the solid soluble limit or more;
etching the polycrystalline silicon film to form, on the gate insulating film, a polycrystalline silicon gate layer to which the metal material is introduced, the polycrystalline silicon gate layer forming part of a gate electrode layer;
forming source and drain regions at both sides of the polycrystalline silicon gate layer; and
segregating the metal material from the polycrystalline silicon gate layer by perform heat treatment to form a metal material segregation layer by the metal material between the gate insulating film and the polycrystalline silicon gate layer.

9. A method according to claim 8, wherein the metal material segregation layer has an electron density of $1.0 \times 10^{21}$ atoms/cm$^3$ or more.

10. A method according to claim 8, wherein the metal material is one selected from indium (In), gallium (Ga), thallium (Tl), tin (Sn), lead (Pb), antimony (Sb), bismuth (Bi), selenium (Se), and tellurium (Te).

11. A method according to claim 8, wherein the metal material is a metal alloy of those selected from indium (In), gallium (Ga), thallium (Tl), tin (Sn), lead (Pb), antimony (Sb), bismuth (Bi), selenium (Se), and tellurium (Te).

12. A method according to claim 8, wherein the metal material segregation layers is formed so as to have a thickness of 5 nm or less.

13. A method according to claim 8, wherein the metal material segregation layers is formed so as to have a thickness of 1 nm or less.

14. A method of manufacturing a semiconductor device, comprising:
forming a gate insulating film on a semiconductor substrate;
forming a polycrystalline silicon film on the gate insulating film;
introducing a first metal material into a first region of the polycrystalline silicon film at an amount of the solid soluble limit or more;
introducing a second metal material into a second region of the polycrystalline silicon film at an amount of the solid soluble limit or more;
etching the polycrystalline silicon film to form, on the gate insulating film, a first polycrystalline silicon gate layer to which the first metal material is introduced and a second polycrystalline silicon gate layer to which the second metal material is introduced, the first polycrystalline silicon gate layer forming part of a first gate electrode layer and the second polycrystalline silicon gate layer forming part of a second gate electrode layer;
forming source and drain regions at both sides of each of the first and second polycrystalline silicon gate layers; and performing heat treatment to separate the first metal material from the first polycrystalline silicon gate layer to form a first segregation layer by the segregated first metal material between the gate insulating film and the first polycrystalline silicon gate layer and separate the second metal material from the second polycrystalline silicon gate layer to form a second segregation layer by the segregated second metal material between the gate insulating film and the second polycrystalline silicon gate layer.

15. A method according to claim 14, wherein the first and second metal material segregation layers have an electron density of $1.0 \times 10^{21}$ atoms/cm$^3$ or more.

16. A method according to claim 14, wherein the first and second metal materials are one selected from indium (In), gallium (Ga), thalium (Tl), tin (Sn), lead (Pb), antimony (Sb), bismuth (Bi), selenium (Se), and tellurim (Te).

17. A method according to claim 14, wherein the first and second metal materials are a metal alloy of those selected from indium (In), gallium (Ga), thalium (Tl), tin (Sn), lead (Pb), antimony (Sb), bismuth (Bi), selenium (Se), and tellurim (Te).

18. A method according to claim 14, wherein the first and second metal material segregation layers are formed so as to have a thickness of 5 nm or less.

19. A method according to claim 14, wherein the first and second metal material segregation layers are formed so as to have a thickness of 1 nm or less.

* * * * *

UNITED STATES PATENT AND TRADEMARK OFFICE
CERTIFICATE OF CORRECTION

PATENT NO. : 6,833,596 B2
DATED : December 21, 2004
INVENTOR(S) : Matsuo

It is certified that error appears in the above-identified patent and that said Letters Patent is hereby corrected as shown below:

Column 18,
Line 24, change "perform" to -- performing --.

Column 20,
Lines 1 and 5, change "thalium (TI)," to -- thallium (T1), --.
Lines 2 and 6-7, change "tellurim" to -- tellurium --.

Signed and Sealed this

Nineteenth Day of April, 2005

JON W. DUDAS
*Director of the United States Patent and Trademark Office*